(12) United States Patent
Liu et al.

(10) Patent No.: US 6,838,691 B2
(45) Date of Patent: Jan. 4, 2005

(54) CHALCOGENIDE MEMORY AND METHOD OF MANUFACTURING THE SAME

(75) Inventors: Mu-Yi Liu, Taichung (TW); Tso-Hung Fan, Banchiau (TW); Kwang-Yang Chan, Hsinchu (TW); Yen-Hung Yeh, Taoyuan Hsien (TW); Tao-Cheng Lu, Kaohsiung (TW)

(73) Assignee: Macronix International, Co., Ltd., Hsin-chu (TW)

( * ) Notice: Subject to any disclaimer, the term of this patent is extended or adjusted under 35 U.S.C. 154(b) by 331 days.

(21) Appl. No.: 10/090,542

(22) Filed: Mar. 4, 2002

(65) Prior Publication Data

US 2003/0166340 A1 Sep. 4, 2003

(51) Int. Cl.$^7$ .......................... H01L 29/04; H01L 29/06
(52) U.S. Cl. .................. 257/3; 257/4; 257/5; 438/380
(58) Field of Search .................. 257/3–5; 438/141, 438/380, 524–527, 603–606, 107

(56) References Cited

U.S. PATENT DOCUMENTS

| | | | |
|---|---|---|---|
| 5,751,012 A | * | 5/1998 | Wolstenholme et al. ....... 257/5 |
| 5,789,758 A | * | 8/1998 | Reinberg ....................... 257/3 |
| 6,284,643 B1 | * | 9/2001 | Reinberg ..................... 438/622 |
| 6,653,195 B1 | * | 11/2003 | Gonzalez et al. ........... 438/380 |

* cited by examiner

Primary Examiner—Duy-Vu N. Deo
(74) Attorney, Agent, or Firm—Fish & Richardson P.C.

(57) ABSTRACT

A method of manufacturing chalcogenide memory in a semiconductor substrate. The method includes the steps of forming a N+ epitaxy layer on the semiconductor substrate; forming a N– epitaxy layer on the N+ epitaxy layer; forming a first STI in the N+ and N– epitaxy layers to isolate a predetermined word line region; forming a second STI in the N– epitaxy layer to isolate a predetermined P+ doped region; forming a dielectric layer on the N– epitaxy layer; patterning the dielectric layer to form a first opening and performing a N+ doping on the N– epitaxy layer via the first opening such that a N+ doped region is formed in the N– epitaxy layer and connected to the N+ epitaxy layer; patterning the dielectric layer to form a second opening and performing a P+ doping on the N– epitaxy layer such that a P+ doped region is formed; forming contact plugs in the first opening and the second opening respectively; and forming an electrode on each contact plug, wherein the electrode includes a lower electrode, a chalcogenide layer and an upper electrode.

8 Claims, 8 Drawing Sheets

CHALCOGENIDE MEMORY AND METHOD OF MANUFACTURING THE SAME

BACKGROUND OF THE INVENTION

1. Field of the Invention

The present invention relates to memory device and, more particularly, to a novel structure of chalcogenide memory and a method of manufacturing the same.

2. Description of the Prior Art

Figure 1:
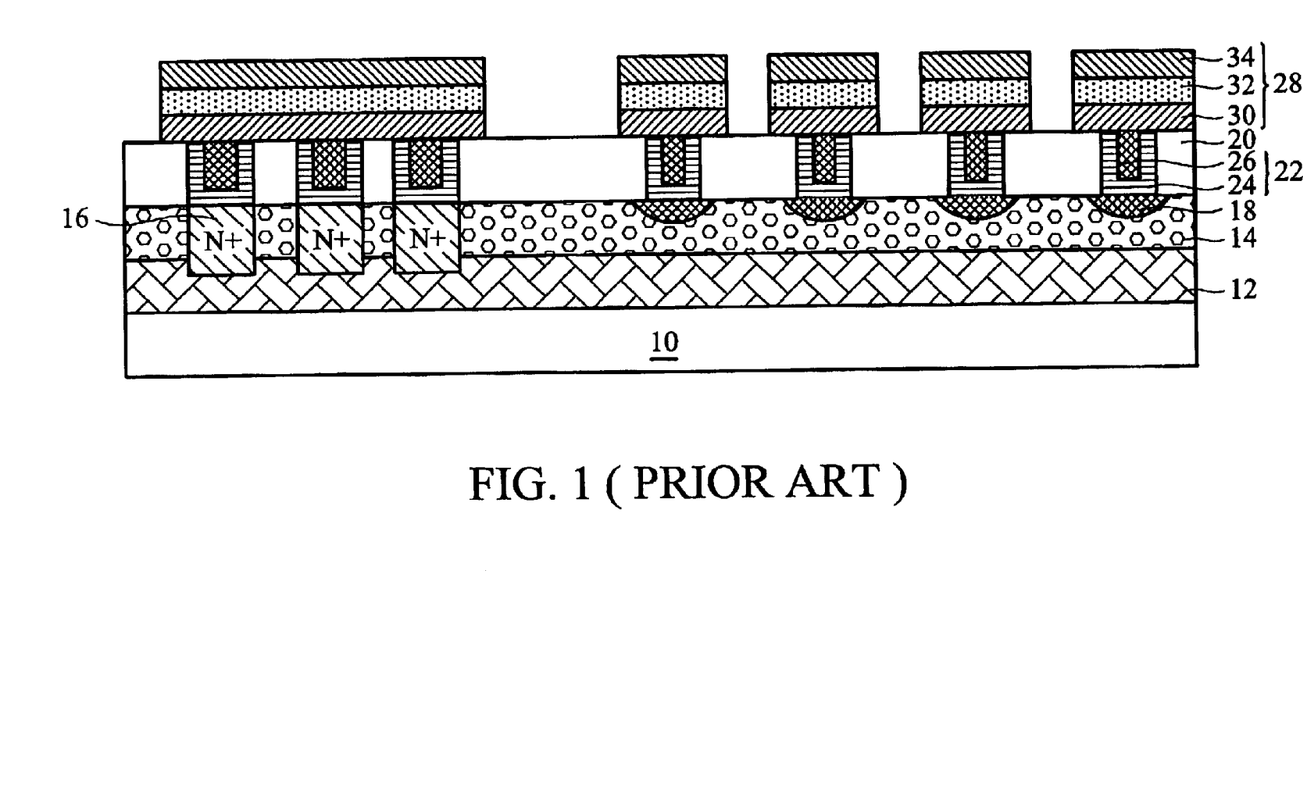
FIG. 1 (Prior Art) is a cross-section of a conventional chalcogenide memory.

A conventional chalcogenide memory structure is shown in FIG. 1 (Prior Art). In FIG. 1, a N+ doping layer 12 is formed on the substrate 10. A N− doping layer 14 is formed on the N+ doping layer 12. A N+ doped region 16 formed in the N− doping layer 14. A P+ doped region 18 is formed in the N− doping layer 14. A dielectric layer 20 is formed on the substrate generally consisting of a $SiO_2$ layer. A contact plug 22 includes a barrier layer 24 and a metal layer 26. An electrode is formed on contact plug 22, wherein the electrode 28 includes a lower electrode 30, a chalcogenide layer 32 and an upper electrode 34.

However, this structure has some essential disadvantages. Since thickness and doping concentration of the N− doping layer and the N+ doping layer are not easily controlled, a breakdown voltage (BDV) can not be adjusted. In addition, since there is no isolation, P+/P+ punch and WL/WL (word line) punch easily occur. Thus, the minimization of the feature size can not be achieved.

SUMMARY OF THE INVENTION

As semiconductor devices become more integrated, the minimization of feature size and multilevel interconnections are needed. Therefore, an object according to the present invention is to provide a novel structure of chalcogenide memory characterized by minimization of the feature size and a method of manufacturing the same.

The present invention achieves the above-indicated object by providing a novel structure of chalcogenide memory and a method of manufacturing the same that is formed on a semiconductor substrate. Epitaxy layers and STIs are employed to replace conventional implantation. The use of the epitaxy layers can increase a thickness of a N+ doping region and a N− doping region respectively, and doping concentrations are well mixed. The use of the STIs can avoid P+/P+ punch and WL/WL (word line) punch. Therefore, minimization of the feature size can be achieved.

The present invention provides a novel structure of chalcogenide memory. The device is formed on a semiconductor substrate. The device includes: a N+ epitaxy layer formed on the semiconductor substrate; a N− epitaxy layer formed on the N+ epitaxy layer; a first STI formed in the N+ and N− epitaxy layers to isolate a word line region; a P+ doping region formed in the N− epitaxy layer; a second STI formed in the N− epitaxy layer to isolate the P+ doped region; a N+ doped region formed in the N− epitaxy layer and connected to the N+ epitaxy layer; contact plugs formed on the N+ doped region and the P+ doped region respectively; and an electrode formed on each contact plug, wherein the electrode includes a lower electrode, a chalcogenide layer and an upper electrode.

Furthermore, the present invention provides a method of manufacturing chalcogenide memory in a semiconductor substrate. Firstly, a N+ epitaxy layer and a N− epitaxy layer are subsequently formed on the semiconductor substrate. Next, a first STI is formed in the N+ and N− epitaxy layers to isolate a predetermined word line region and a second STI is formed in the N− epitaxy layer to isolate a predetermined P+ doping region. Next, a dielectric layer is formed and patterned on the N− epitaxy layer, then a N+ doping is performed on a portion of the N− epitaxy layer such that a N+ doped region is formed in the N− epitaxy layer and connected to the N+ epitaxy layer. Next, a P+ doping is performed on the N− epitaxy layer such that a P+ doped region is formed. Next, contact plugs are formed on the N+ doped region and P+ doped region respectively through the dielectric layer. Finally, an electrode is formed on each contact plug.

BRIEF DESCRIPTION OF THE DRAWINGS

The following detailed description, given by way of example and not intended to limit the invention solely to the embodiments described herein, will best be understood in conjunction with the accompanying drawings, in which.

DETAILED DESCRIPTION OF THE PREFERRED EMBODIMENTS

Figure 2:
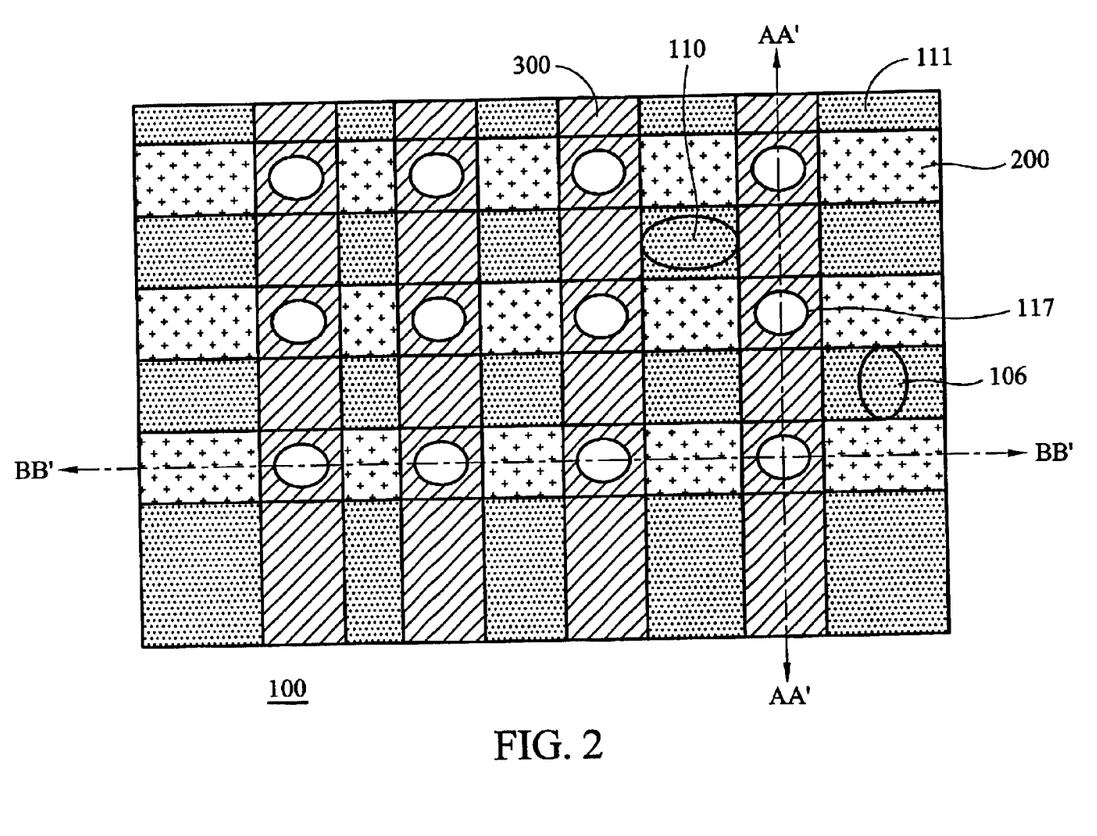
FIG. 2 is a top-view of a chalcogenide memory in accordance with the present invention.

FIG. 2 is a top-view of a chalcogenide memory in accordance with the present invention. In FIG. 2, numeral 100 represents a semiconductor substrate. Numeral 111 represents a dielectric layer formed on the substrate 100 generally consisting of a $SiO_2$ layer. Numeral 117 represents a P+ doped region. Numeral 200 represents a word line. Numeral 300 represents a bit line. Numeral 106 represents a first STI, while numeral 110 represents a second STI.

Figure 3:
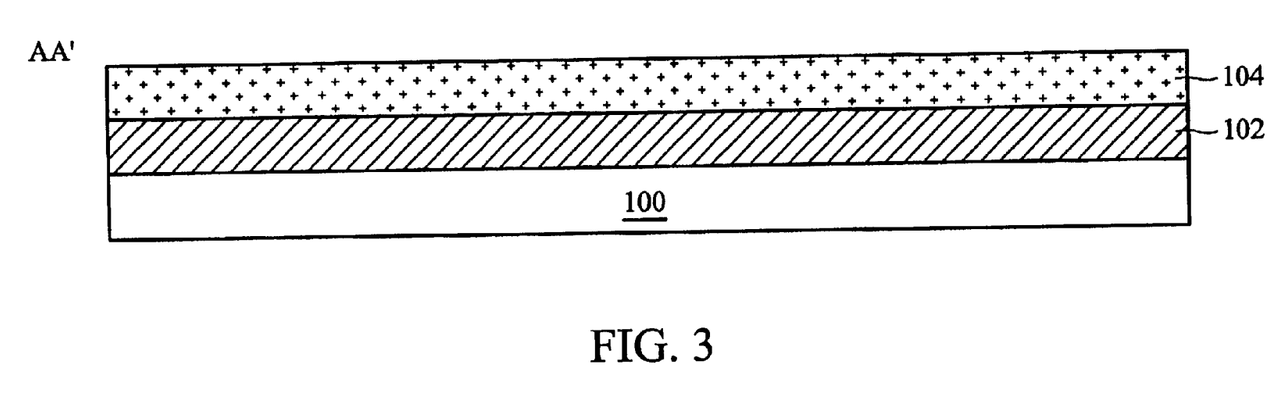
FIGS. 3 through 8 illustrate, in cross section, the process in accordance with the present invention.
Figure 4:
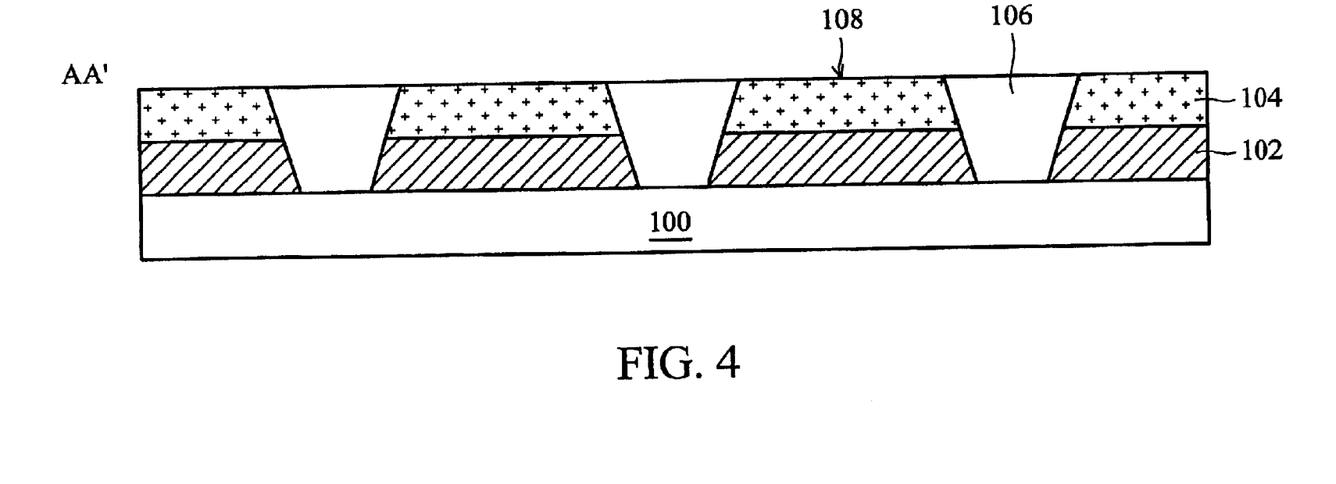

FIGS. 3 and 4 are cross-sectional in accordance with a cut line AA' of FIG. 2, while FIGS. 5 to 8 are cross-sectional in accordance with a cut line BB' of FIG. 2. As shown in FIG. 3, this embodiment begins by providing a semiconductor substrate 100. An N+ epitaxy layer 102 and a N− epitaxy layer 104 are subsequently formed on the semiconductor substrate 100. The N+ epitaxy layer 102 and the N− epitaxy layer 104 are preferably formed by the selective epitaxial method. The N+ epitaxy layer 102 preferably has a thickness of 400 to 600 angstroms, while the N− epitaxy layer 104 preferably has a thickness of 800 to 1200 angstroms.

As shown in FIG. 4, a first STI 106 is formed in the N+ epitaxy layer 102 and the N− epitaxy layer 104 to isolate a predetermined word line region 108. A STI process generally includes the following steps. First, using dry or wet etching with a mask, a trench is formed in a semiconductor substrate. Next, an insulating layer is deposited on the entire surface of the semiconductor substrate to fill the trench. The insulating layer is typically formed of silicon dioxide by chemical vapor deposition (CVD), such as atmospheric pressure chemical vapor deposition (APCVD), sub-atmospheric pressure chemical vapor deposition (SACVD) or high density plasma CVD (HDPCVD). Finally, CMP is used to planarize the insulating layer. Thus, the insulating layer remaining in the trench serves as a STI region.

Figure 5:
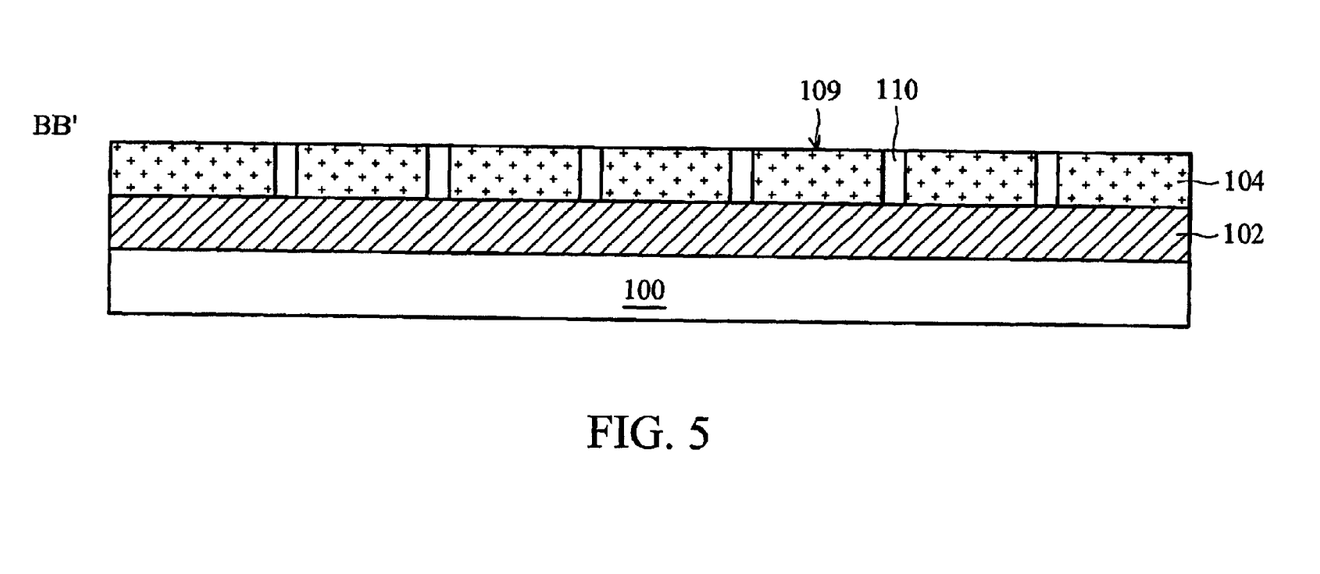

As shown in FIG. 5, a second STI 110 is formed in the N− epitaxy 104 layer to isolate a predetermined P+ doping region 109. The second STI 110 is formed by the above STI process.

Figure 6:
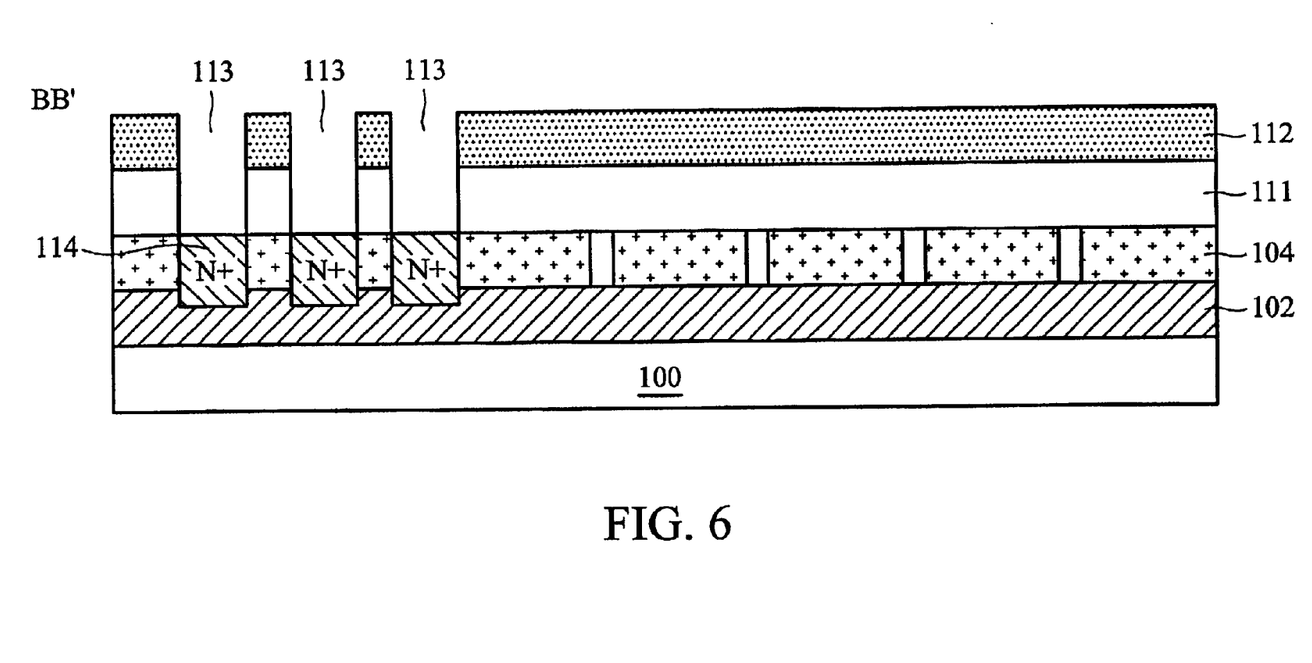

As shown in FIG. 6, a dielectric layer 111 is formed on N− epitaxy layer 104, then patterned with photoresist 112. The dielectric layer 111 is generally a tetra-ethyl-ortho-silicate (TEOS) and preferably formed by low pressure chemical vapor deposition (LPCVD). The dielectric layer 111 preferably has a thickness of 2000 to 3000 angstroms. Anisotropically reactive ion etching (RIE) is employed to etch the dielectric layer 111 to form a opening 113, then a N+ doping with arsenic or phosphorus is performed on a portion of the N− epitaxy layer 104 such that a N+ doped region 114 is formed in the N− epitaxy layer 104 and connected to the N+ epitaxy layer 102. Dosage of the doping is between $10^{15}$ and $2 \times 10^{16}$ atoms/cm$^2$. Energy of the doping is between 10 and 30 keV.

Figure 7:
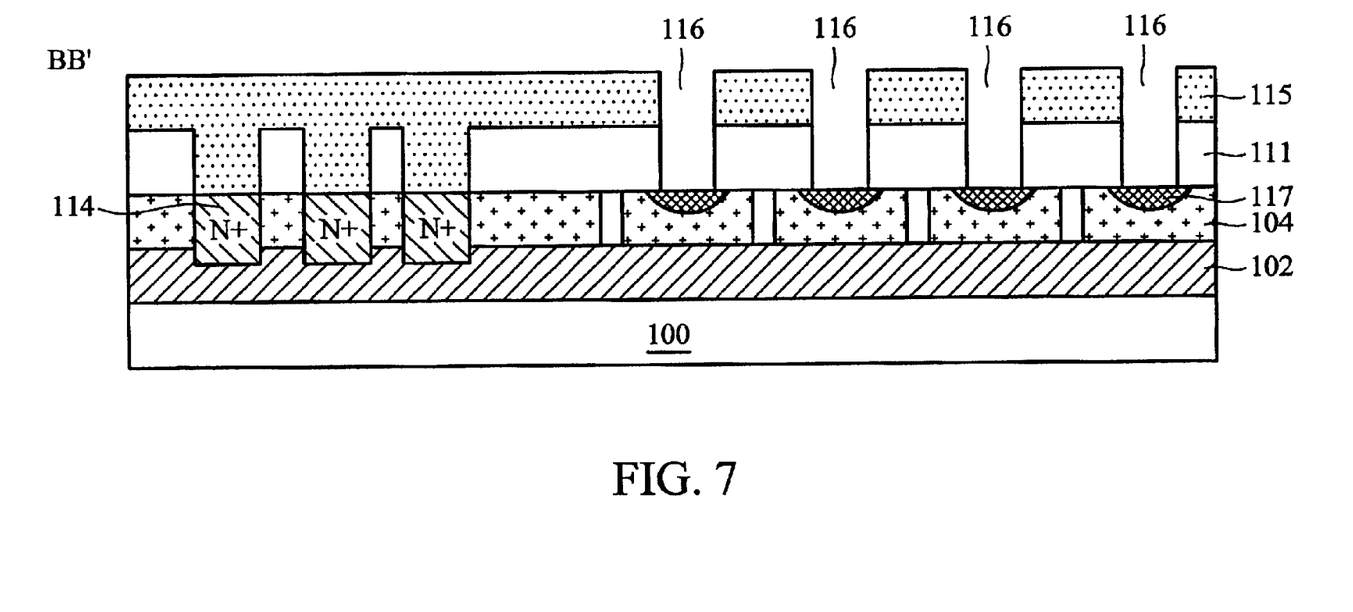

As shown in FIG. 7, the dielectric layer 111 in patterned with photoresist 115, then anisotropically reactive ion etching (RIE) is employed to etch the dielectric layer 111 to form a an opening 116, then a P+ doping with boron is performed in the predetermined P+ doping region 109 (as shown in FIG. 5) such that a P+ doped region 117 is formed. Dosage of the doping is between $10^{15}$ and $1 \times 10^{16}$ atoms/cm$^2$. Energy of the doping is between 1 and 3 keV.

Figure 8:
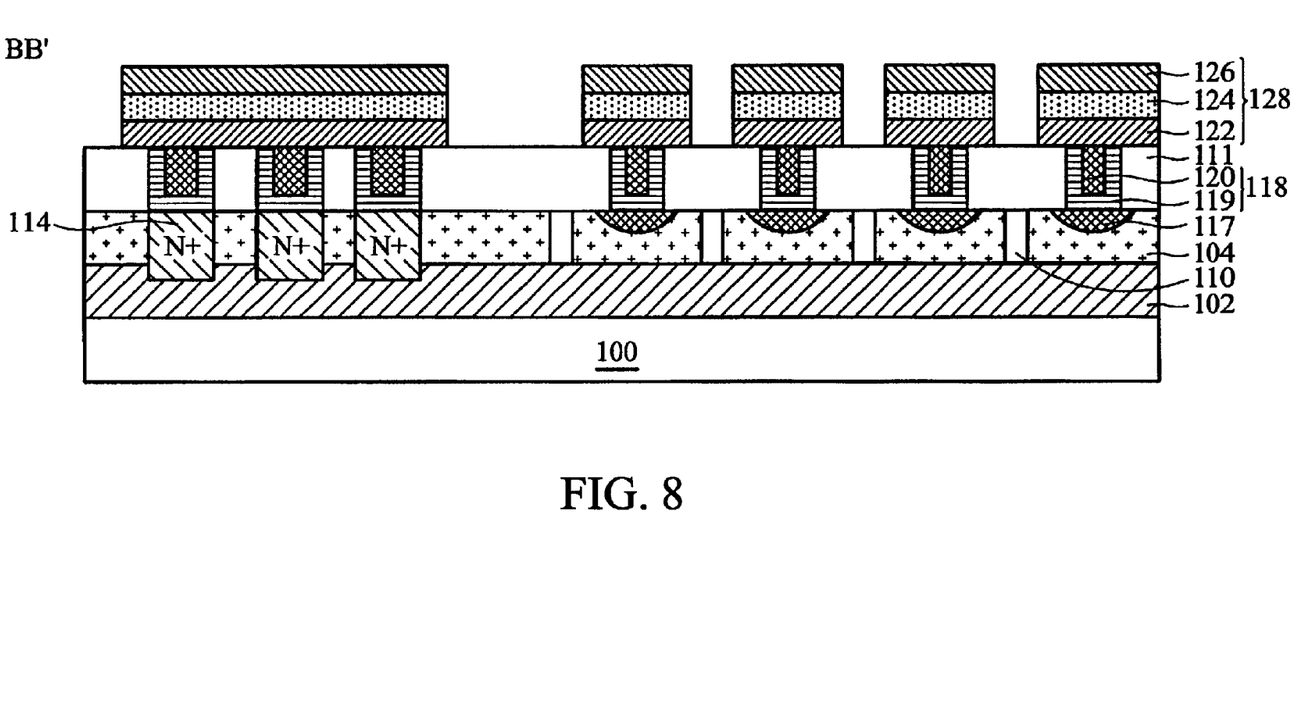

As shown in FIG. 8, contact plugs 118 are formed in the opening 113 and the opening 116 respectively, wherein each contact plug 118 includes a barrier layer 119 and a metal layer 120. The barrier layer 119 is typically formed of TiN by chemical vapor deposition. The metal layer 120 is typically formed of Al or Cu by physical vapor deposition. The electrode 128 is formed on each contact plug 118, wherein the electrode 128 includes a lower electrode 122, a chalcogenide layer 124 and an upper electrode 126.

FIG. 8 is a cross-section of a structure of chalcogenide memory according to the present invention. The device is formed on a semiconductor substrate 100 and a N+ epitaxy layer 102, a N− epitaxy layer 104, a first STI 106 (shown in FIG. 4), a second STI 110, a N+ doping region 114, a P+ doping region 117, contact plugs 118 and electrodes 128.

The first STI 106 is formed in the N+ epitaxy layer 102 and the N− epitaxy layer 104 to isolate a word line region (shown in FIG. 4). The P+ doping region 117 is formed in the N− epitaxy layer 104. The second STI 110 is formed in the N− epitaxy layer 104 to isolate the P+ doped region 117. The N+ doped region 114 is formed in the N− epitaxy layer 104 and connected to the N+ epitaxy layer 102. The contact plugs 118 are formed on the N+ doped region 114 and the P+ doped region 117 respectively, wherein each contact plug 118 includes a barrier layer 119 and a metal layer 120. The electrode 128 is formed on each contact plug 118, wherein the electrode 128 includes a lower electrode 122, a chalcogenide layer 124 and an upper electrode 126.

The N+ epitaxy layer 102 preferably has a thickness of 400 to 600 angstroms, while the N− epitaxy layer 104 preferably has a thickness of 800 to 1200 angstroms. The first STI 106 and the second STI 110 are formed by the above STI process.

It is to be understood that the present invention is not limited to the embodiments described above, but encompasses any and all embodiments within the scope of the following claims.

What is claimed is:

1. A structure of chalcogenide memory, comprising:
   a semiconductor substrate;
   a N+ epitaxy layer formed on the semiconductor substrate;
   a N− epitaxy layer formed on the N+ epitaxy layer;
   a first STI formed in the N+ and N− epitaxy layers to isolate a word line region;
   a P+ doping region formed in the N− epitaxy layer;
   a second STI formed in the N− epitaxy layer to isolate the P+ doped region;
   a N+ doped region formed in the N− epitaxy layer and connected to the N+ epitaxy layer;
   contact plugs formed on the N+ doped region and the P+ doped region respectively; and
   an electrode formed on each contact plug, wherein the electrode includes a lower electrode, a chalcogenide layer and an upper electrode.

2. The structure as recited in claim 1, wherein the N+ epitaxy layer has a thickness of 400 to 600 angstroms.

3. The structure as recited in claim 1, wherein the N− epitaxy layer has a thickness of 800 to 1200 angstroms.

4. The structure as recited in claim 1, wherein the first STI is formed in the N+ epitaxy layer and the N− epitaxy layer.

5. The structure as recited in claim 1, wherein the first STI is formed by a dry or wet etching.

6. The structure as recited in claim 1, wherein the second STI is formed by a dry or wet etching.

7. The structure as recited in claim 1, wherein the N+ epitaxy layer is formed by selective epitaxial method.

8. The structure as recited in claim 1, wherein the N− epitaxy layer is formed by selective epitaxial method.

* * * * *